United States Patent
Zhang

(10) Patent No.: US 9,425,399 B2
(45) Date of Patent: Aug. 23, 2016

(54) ORGANIC LIGHT-EMITTING DIODE (OLED) DISPLAY PANEL, MANUFACTURING METHOD THEREOF AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Jinzhong Zhang, Beijing, CA (US)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/558,909

(22) Filed: Dec. 3, 2014

(65) Prior Publication Data

US 2016/0056378 A1 Feb. 25, 2016

(30) Foreign Application Priority Data

Aug. 22, 2014 (CN) .......................... 2014 1 0419804

(51) Int. Cl.
*H01J 9/00* (2006.01)
*H01L 51/00* (2006.01)
(Continued)

(52) U.S. Cl.
CPC .......... *H01L 51/001* (2013.01); *H01L 27/3211* (2013.01); *H01L 51/56* (2013.01)

(58) Field of Classification Search
CPC .... H01L 51/001; H01L 27/3211; H01L 51/56
See application file for complete search history.

(56) References Cited

U.S. PATENT DOCUMENTS 6,221,438 B1 4/2001 Matthies
6,744,197 B2 * 6/2004 Park ..................... H01L 27/3253
 257/E27.111

(Continued)

FOREIGN PATENT DOCUMENTS

CN 1605652 A 4/2005
CN 1684774 A 10/2005
(Continued)

OTHER PUBLICATIONS

First Chinese Office Action Appln. No. 201410419804.5; dated Mar. 4, 2016.
(Continued)

*Primary Examiner* — Joseph L Williams
(74) *Attorney, Agent, or Firm* — Ladas & Parry LLP

(57) ABSTRACT

An organic light-emitting diode (OLED) display panel, a manufacturing method thereof and a display device are provided. In the manufacturing method, pixel electrodes, required to be deposited with a material, on a base substrate are charged, and electrodes at an evaporation source are charged to form an electric field; evaporation material corresponding to the material required to be deposited are placed into the evaporation source and ionized, and the ionized evaporation material are deposited on the base substrate under the action of the electric field; deposited material in other pixel units are etched off and removed, so that the evaporation material only on the previously charged pixel electrodes on the base substrate are retained; and patterns of the required material are formed by the processes of deposition and etching in turn. The manufacturing method improves the resolution of finished products and can help to improve the resolution of the OLED.

8 Claims, 2 Drawing Sheets

(51) Int. Cl.
*H01L 51/56* (2006.01)
*H01L 27/32* (2006.01)

(56) References Cited

U.S. PATENT DOCUMENTS

| | | |
|---|---|---|
| 2006/0068082 A1 | 3/2006 | Marra et al. |
| 2008/0018236 A1 | 1/2008 | Arai et al. |
| 2015/0162535 A1 | 6/2015 | Shen et al. |

FOREIGN PATENT DOCUMENTS

| | | |
|---|---|---|
| CN | 1782120 A | 6/2006 |
| CN | 1874000 A | 12/2006 |
| CN | 101015234 A | 8/2007 |
| CN | 103305794 A | 9/2013 |
| CN | 103700780 A | 4/2014 |
| WO | 0025937 A1 | 5/2000 |
| WO | 2007144130 A1 | 12/2007 |

OTHER PUBLICATIONS

Second Chinese Office Action dated May 23, 2015; Appln. No. 201410419804.5.

* cited by examiner

ORGANIC LIGHT-EMITTING DIODE (OLED) DISPLAY PANEL, MANUFACTURING METHOD THEREOF AND DISPLAY DEVICE

TECHNICAL FIELD

Embodiments of the present disclosure relate to an organic light-emitting diode (OLED) display panel, a manufacturing method thereof and a display device.

BACKGROUND

Currently, OLED panels have gradually dominated the display field due to the characteristics such as low power consumption, high color saturation, wide viewing angle, low thickness, no backlight and the like.

Evaporation technique is one of key techniques in the process of manufacturing an OLED panel. In order to allow the entire OLED panel to display full-color images, pixel units in the panel must display different colors. Currently, OLEDs mainly adopt red, green and blue (RGB) light emission layers (EML) to achieve better luminous efficiency. The evaporation technique is mainly applied in the film forming process of OLED material of the RGB EML. In the film forming process, a fine metal mask (FMM) is adopted for evaporation, and a red OLED material, a green OLED material and a blue OLED material are evaporated in different pixel units of the OLED panel side by side.

SUMMARY

At least one embodiment of the present disclosure provides a method for manufacturing an organic light-emitting diode (OLED) display panel, which comprises: placing a base substrate provided with pixel electrodes of pixel units into an evaporation chamber; electrically charging pixel electrodes of pixel units, required to be deposited with a material, on the base substrate, electrically charging electrodes disposed at an evaporation source in the evaporation chamber, and forming an electric field; placing an evaporation material corresponding to the material required to be deposited into the evaporation source, ionizing the evaporation material, and depositing the ionized evaporation material on the base substrate under the action of the electric field; and etching the base substrate provided with the ionized evaporation material by an etching process, and retaining the evaporation material only on the previously charged pixel electrodes on the base substrate.

At least one embodiment of the present disclosure further provides an OLED display panel, which is manufactured by the foregoing method for manufacturing the OLED display panel.

At least one embodiment of the present disclosure further provides a display panel, which comprises the OLED display panel provided by at least one embodiment of the present disclosure.

BRIEF DESCRIPTION OF THE DRAWINGS

Simple description will be given below to the accompanying drawings of the embodiments to provide a more clear understanding of the technical proposals of the embodiments of the present disclosure. It will be obvious to those skilled in the art that the drawings described below only involve some embodiments of the present disclosure but are not intended to limit the present disclosure.

DETAILED DESCRIPTION

Figure 1A:
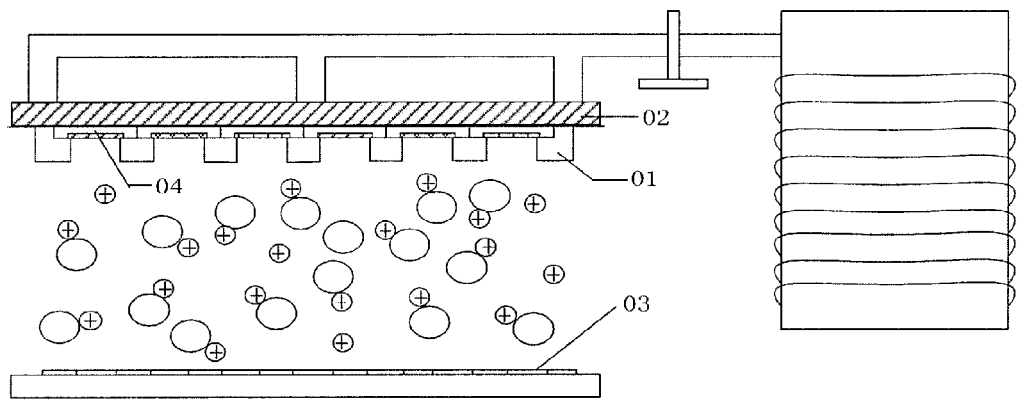
FIGS. 1a to 1g are respectively schematic structural views illustrating the state after each of the steps of a method for manufacturing an OLED display panel, provided by an embodiment 1 of the present disclosure, is executed.

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. It will be obvious to those skilled in the art that the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

The shape and the thickness of film layers in the accompanying drawings do not reflect the true scale thereof and are only intended to illustrate the content of the embodiment of the present disclosure.

In research the inventors have found that: in the process of film forming by adoption of an FMM, due to the inevitable error in the alignment of the FMM and a base substrate, the FMM tends to be deformed due to the factors such as temperature, magnetic field, tensile stress and the like, which is unfavorable to the production of an OLED panel with a high resolution.

At least one embodiment of the present disclosure provides a method for manufacturing an OLED display panel, which comprises the following steps.

S101: placing a base substrate provided with pixel electrodes of pixel units into an evaporation chamber.

For instance, the base substrate may be placed into the evaporation chamber after the pixel electrodes and a pixel defining layer (PDL) on the pixel electrodes are manufactured on the base substrate. The base substrate may be a glass substrate or a plastic substrate.

S102: electrically charging pixel electrodes of pixel units, required to be deposited with a material, on the base substrate, electrically charging electrodes disposed at an evaporation source in the evaporation chamber, and forming an electric field.

For instance, whether to positively or negatively electrically charge the pixel electrodes of the pixel units (i.e., connected to a positive electrode or negative electrode of a power source), required to be deposited with the same material, on the base substrate can be determined according to the electrical property of the evaporation material when the evaporation material are ionized into electrically charged particles; subsequently, whether to negatively or positively electrically charge the electrodes disposed at the evaporation source in the evaporation chamber is correspondingly determined. In this way, an electric field is formed correspondingly.

S103: placing an evaporation material corresponding to the material required to be deposited into the evaporation source, ionizing the evaporation material, and depositing the ionized evaporation material on the base substrate under the action of the electric field.

For instance, the evaporation material corresponding to the material required to be deposited is placed into the evaporation source and ionized. As only the pixel electrodes of the pixel units required to be deposited with the material are electrically charged in the step S102, the thickness of the material deposited in the pixel units, required to be deposited with the ionized evaporation material, under the action of the electric field can be larger than that of other pixel units.

S104: etching the base substrate provided with the ionized evaporation material by an etching process, and retaining the evaporation material only on the previously charged pixel electrodes on the base substrate.

In order to form patterns corresponding to pixel units provided on the base substrate, for instance, in the process of etching the base substrate provided with the ionized evaporation material by the etching process, ionized evaporation material deposited in other pixel units, except the pixel units required to be deposited with the material, may be etched off and removed, and hence the evaporation material only on the previously electrically charged pixel electrodes on the base substrate are retained.

In the method for manufacturing the OLED display panel, provided by an embodiment of the present disclosure, when the evaporation material is ionized into positively charged particles, in order to form the pattern deposited on the OLED display panel, the process of electrically charging the pixel electrodes of the pixel units, required to be deposited with the same material, on the base substrate and electrically charging the electrodes disposed at the evaporation source in the evaporation chamber in the step S102, for instance, may be conducted as follows.

The pixel electrodes of the pixel units, required to be deposited with the same material, on the base substrate are negatively charged, and the electrodes disposed at the evaporation source in the evaporation chamber are positively charged, so that the electric field pointing from the electrodes at the evaporation source to the pixel electrodes on the base substrate is formed in the evaporation chamber, and hence subsequently formed positively charged particles are deposited to the pixel electrodes under the action of the electric field. Moreover, as only the pixel electrodes of the pixel units required to be deposited with the same material are negatively charged, the thickness of the material deposited herein can be larger than that of pixel electrodes of other pixel units, and hence the material deposited in other pixel units can be etched, and only the material of the pixel units required to be deposited with the material is retained in the process of etching the film layers of the base substrate by the etching process in the subsequent step S104.

In the method for manufacturing the OLED display panel, provided by at least one embodiment of the present disclosure, as the electric field pointing from the electrodes at the evaporation source to the pixel electrodes on the base substrate is formed in the evaporation chamber in the step S102, the following two ways may be adopted in order to ionize the evaporation material, namely ionize the evaporation material into positively charged particles, in the step S103.

First way is to evaporate the evaporation material after the evaporation material corresponding to the material required to be deposited is placed into the evaporation source, allowing a small amount of free electrons in the electric field to collide with the evaporated evaporation material, and ionizing the evaporation material into positively charged particles.

Second means is to polarize the evaporation material under the action of an external electric field before the evaporation material corresponding to the material required to be deposited is placed into the evaporation source, namely polarizing the evaporation material into positively charged particles.

Moreover, in the method for manufacturing the OLED display panel, provided by at least one embodiment of the present disclosure, when the evaporation material is ionized into negatively electrically charged particles, in order to form the patterns deposited on the OLED display panel, the process of electrically charging the pixel electrodes of the pixel units, required to be deposited with the same material, on the base substrate and electrically charging the electrodes disposed at the evaporation source in the evaporation chamber in the step S102, for instance, may be as follows.

The pixel electrodes of the pixel units, required to be deposited with the same material, on the base substrate are positively electrically charged and the electrodes disposed at the evaporation source in the evaporation chamber are negatively electrically charged, so that the electric field pointing from the pixel electrodes on the base substrate to the electrodes at the evaporation source is formed in the evaporation chamber, and hence subsequently formed negatively charged particles are deposited to the pixel electrodes under the action of the electric field. Moreover, as only the pixel electrodes of the pixel units required to be deposited with the same material are positively charged, the thickness of the material deposited herein can be larger than that of pixel electrodes of other pixel units, and hence material deposited in other pixel units may be etched and only the material of the pixel units required to be deposited with the material is retained in the process of etching the film layers of the base substrate by the etching process in the subsequent step S104.

In the method for manufacturing the OLED display panel, provided by at least one embodiment of the present disclosure, as the electric field pointing from the pixel electrodes on the base substrate to the electrodes at the evaporation source is formed in the evaporation chamber in the step S102, the process of ionizing the evaporation material, namely ionizing the evaporation material into the negatively charged particles in the step S103, for instance, may also be as follows.

At first, argon gas is introduced into the evaporation chamber before the evaporation material corresponding to the material required to be deposited is placed into the evaporation source, and hence electrons are formed in the evaporation chamber after the argon gas is ionized under the action of the electric field; and subsequently, the evaporation material is evaporated after the evaporation material corresponding to the material required to be deposited is placed into the evaporation source, and hence particles of the evaporation material is driven to adsorb the electrons to form negatively charged particles.

In the method for manufacturing the OLED display panel, provided by at least one embodiment of the present disclosure, the evaporation material may be a red OLED material, a green OLED material or a blue OLED material and may also be OLED material of another color, e.g., a white OLED material. No limitation will be imposed here.

Detailed description will be given below to the method for manufacturing the OLED display panel, provided by the embodiment of the present disclosure, with reference to three preferred embodiments. In each embodiment, description is given by taking the case the evaporation material are a red OLED material, a green OLED material and a blue OLED material in turn as an example.

Embodiment 1

The method for manufacturing the OLED display panel provided by the embodiment 1 of the present disclosure, comprises the following steps:

S201: placing a base substrate provided with pixel electrodes of pixel units into an evaporation chamber.

S202: negatively electrically charging pixel electrodes of pixel units, required to be deposited with a red OLED material, on the base substrate, positively electrically charging electrodes disposed at an evaporation source in the evaporation chamber, and forming an electric field, as illustrated in FIG. 1a.

After the pixel electrodes and a pixel defining layer (PDL) 01 disposed on the pixel electrodes are manufactured and the base substrate 02 is placed into the evaporation chamber in the step S201, a positive electrode 03 may be in advance mounted on the evaporation source in the evaporation chamber in a vacuum evaporation system; pixel electrodes 04 of pixel units required to be deposited with red OLED material are respectively driven on the base substrate 02; and hence the pixel electrodes 04 of the pixel units required to be deposited with the red OLED material are taken as a negative electrode, and an electric field is formed between the positive electrode and the negative electrode.

Figure 1B:
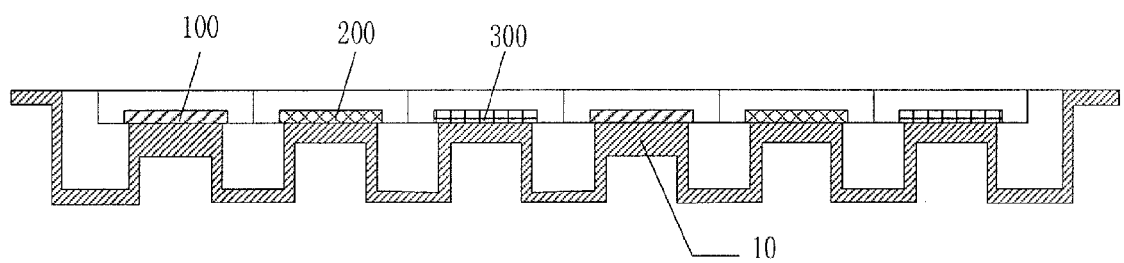

S203: placing an evaporation material corresponding to the required deposited the red OLED material into the evaporation source, evaporating the evaporation material, allowing a small amount of free electrons in the electric field to collide with the evaporated evaporation material, ionizing the evaporation material into positively charged particles, depositing the ionized evaporation material on the base substrate under the action of the electric field, as illustrated in FIG. 1b, and removing the base substrate out of the evaporation chamber.

An evaporation valve is opened; the red OLED material required to be evaporated enters the evaporation source through a pipe and are evaporated into a vacuum chamber through the evaporation source; due to the influence of the electric field, a small amount of free electrons in the chamber are accelerated under the action of the electric field and collide with the evaporated evaporation material; the evaporation material are ionized into positively electrically charged particles, and more electrons are formed in the electric field, and hence more evaporation material are ionized; the ionized evaporation material is driven to move towards the negative electrode under the action of the electric field and deposited on the base substrate; due to the action of the electric field, more material of pixel units 100 required to be deposited with the red OLED material 10 will be evaporated; and the thickness of the evaporation material will be larger than that of pixel units 200 required to be deposited with a green OLED material and pixel units 300 required to be deposited with a blue OLED material.

Figure 1C:
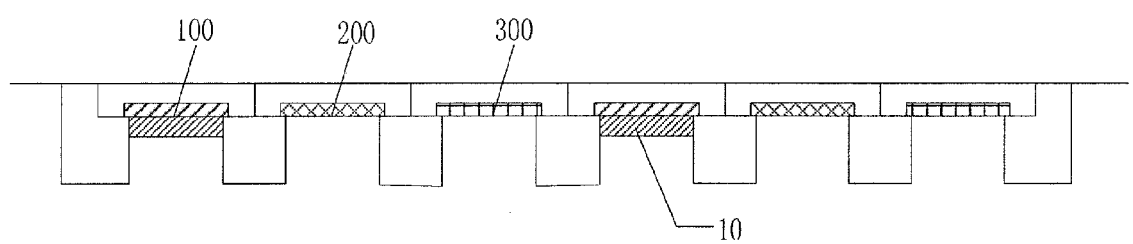

S204: etching the base substrate provided with the ionized evaporation material by an etching process, and retaining the red OLED material only on the previously charged pixel electrodes on the base substrate, as illustrated in FIG. 1c.

Because more material will be evaporated to the pixel units 100 required to be deposited with the red OLED material 10 and the thickness of the evaporation material will be larger than that of the pixel units 200 required to be deposited with the green OLED material and the pixel units 300 required to be deposited with the blue OLED material, the red OLED material 10 with a certain thickness are also retained on the pixel electrodes of the pixel units required to be deposited with the red OLED material 10 after the red OLED material 10 evaporated in other pixel units are etched off and removed in the ion etching process.

S205: placing the base substrate into the evaporation chamber, negatively electrically charging pixel electrodes of pixel units, required to be deposited with green OLED material, on the base substrate, positively electrically charging the electrodes disposed at the evaporation source in the evaporation chamber, and forming an electric field.

Figure 1D:
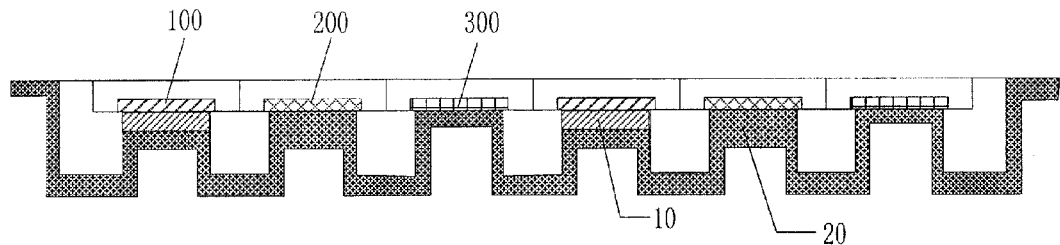

S206: placing an evaporation material corresponding to the green OLED material required to be deposited into the evaporation source, evaporating the evaporation material, allowing a small amount of free electrons in the electric field to collide with the evaporated evaporation material, ionizing the evaporation material into positively charged particles, depositing the ionized evaporation material on the base substrate under the action of the electric field, as illustrated in FIG. 1d, and removing the base substrate.

Due to the action of the electric field, more material will be evaporated to the pixel units 200 required to be deposited with the green OLED material 20, and the thickness of the evaporation material will be larger than that of the pixel units 100 required to be deposited with the red OLED material and the pixel units 300 required to be deposited with the blue OLED material.

Figure 1E:
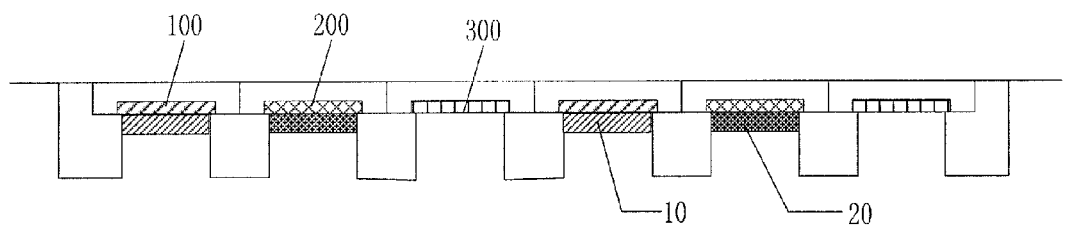

S207: etching the base substrate provided with the ionized evaporation material by an etching process, and retaining the green OLED material only on the previously charged pixel electrodes on the base substrate, as illustrated in FIG. 1e.

Because more material will be evaporated to the pixel units 200 required to be deposited with the green OLED material 20 and the thickness of the evaporation material will be larger than that of the pixel units 100 required to be deposited with the red OLED material and the pixel units 300 required to be deposited with the blue OLED material, the green OLED material 20 with a certain thickness are also retained on the pixel electrodes of the pixel units required to be deposited with the green OLED material 20 after the green OLED material 20 evaporated in other pixel units are etched off and removed in the ion etching process, and hence the pixel electrodes of the pixel units deposited with the red OLED material 10 and the green OLED material 20 are formed.

S208: placing the base substrate into the evaporation chamber, negatively electrically charging pixel electrodes of pixel units, required to be deposited with blue OLED material, on the base substrate, positively electrically charging the electrodes disposed at the evaporation source in the evaporation chamber, and forming an electric field.

Figure 1F:
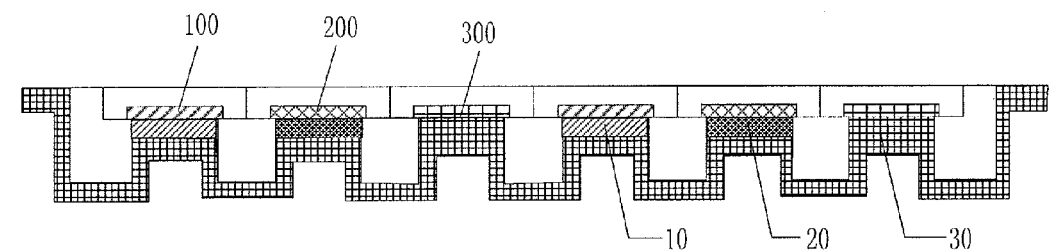

S209: placing an evaporation material corresponding to blue OLED material required to be deposited into the evaporation source, evaporating the evaporation material, allowing a small amount of free electrons in the electric field to collide with the evaporated evaporation material, ionizing the evaporation material into positively charged particles, depositing the ionized evaporation material on the base substrate under the action of the electric field, as illustrated in FIG. 1f, and removing the base substrate.

Due to the action of the electric field, more material will be evaporated to the pixel units 300 required to be deposited with the blue OLED material 30, and the thickness of the evaporation material will be larger than that of the pixel units 100 required to be deposited with the red OLED material and the pixel units 200 required to be deposited with the green OLED material.

Figure 1G:
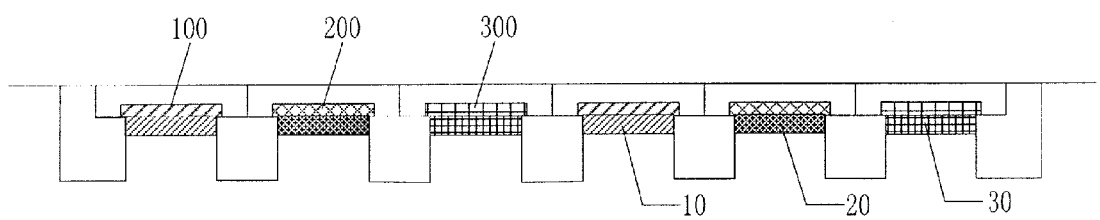

S210: etching the base substrate provided with the ionized evaporation material by an etching process, and only retaining the blue OLED material on the previously charged pixel electrodes on the base substrate, as illustrated in FIG. 1g.

As more material will be evaporated to the pixel units 300 required to be deposited with the blue OLED material 30 and the thickness of the evaporation material will be larger than that of the pixel units 100 required to be deposited with the red OLED material and the pixel units 200 required to be deposited with the green OLED material, the blue OLED material 30 with a certain thickness are also retained on the pixel electrodes of the pixel units required to be deposited with the blue OLED material 30 after the blue OLED material 30 evaporated in other pixel units are etched off and removed in the ion etching process, and hence the pixel electrodes of the pixel units deposited with the red OLED material 10, the green OLED material 20 and the blue OLED material 30 are formed.

After the steps S201 to S210 provided by the embodiment 1, the OLED display panel provided by the embodiment of the present disclosure is manufactured. Patterns of the required materials are formed in the processes of deposition and etching in turn according to the above steps, and hence the problem of limiting the resolution of finished products due to the alignment error in the process of forming the patterns of the material by a mask is avoided, and thus the resolution of the OLED can be improved.

Embodiment 2

The method for manufacturing the OLED display panel, provided by the embodiment 2 of the present disclosure, comprises the following steps:

S301: placing a base substrate provided with pixel electrodes of pixel units into an evaporation chamber.

S302: negatively electrically charging pixel electrodes of pixel units, required to be deposited with a red OLED material, on the base substrate, positively electrically charging electrodes disposed at an evaporation source in the evaporation chamber, and forming an electric field.

S303: polarizing an evaporation material under the action of an external electric field, polarizing the evaporation material into positively charged particles, placing an evaporation material corresponding to the red OLED material required to be deposited into the evaporation source, depositing the ionized evaporation material on the base substrate under the action of the electric field, and removing the base substrate.

The differences between this step and the step S203 of the embodiment 1 are as follows: in the step S303, the evaporation material are polarized under the action of the external electric field before the evaporation material corresponding to the material required to be deposited is placed into the evaporation source; the evaporation material close to the substrate are polarized into positively electrically charged particles; the polarized evaporation material is placed into the evaporation source; and negatively charged pixel electrodes preferably undergo deposition in the process of evaporating the evaporation material to the substrate.

S304: etching the base substrate provided with the ionized evaporation material by an etching process, and retaining the red OLED material only on the previously electrically charged pixel electrodes on the base substrate.

S305: placing the base substrate into the evaporation chamber, negatively electrically charging pixel electrodes of pixel units, required to be deposited with a green OLED material, on the base substrate, positively electrically charging the electrodes disposed at the evaporation source in the evaporation chamber, and forming an electric field.

S306: polarizing an evaporation material under the action of an external electric field, polarizing the evaporation material into positively charged particles, placing an evaporation material corresponding to the green OLED material required to be deposited into the evaporation source, depositing the ionized evaporation material on the base substrate under the action of the electric field, and removing the base substrate.

S307: etching the base substrate provided with the ionized evaporation material by an etching process, and retaining the green OLED material only on the previously charged pixel electrode on the base substrate.

S308: placing the base substrate into the evaporation chamber, negatively electrically charging pixel electrodes of pixel units, required to be deposited with a blue OLED material, on the base substrate, positively electrically charging the electrodes disposed at the evaporation source in the evaporation chamber, and forming an electric field.

S309: polarizing an evaporation material under the action of an external electric field, polarizing the evaporation material into positively charged particles, placing an evaporation material corresponding to the blue OLED material required to be deposited into the evaporation source, depositing the ionized evaporation material on the base substrate under the action of the electric field, and removing the base substrate.

S310: etching the base substrate provided with the ionized evaporation material by an etching process, and retaining the blue OLED material only on the previously charged pixel electrodes on the base substrate.

After the steps S301 to S310 provided by the embodiment 2, the pixel electrodes of the pixel units deposited with the red OLED material, the green OLED material and the blue OLED material are formed, and hence the OLED display panel provided by at least one embodiment is manufactured.

Embodiment 3

The method for manufacturing the OLED display panel, provided by the embodiment 3 of the present disclosure, comprises the following steps:

S401: placing a base substrate provided with pixel electrodes of pixel units into an evaporation chamber.

S402: positively electrically charging pixel electrodes of pixel units, required to be deposited with a red OLED material, on the base substrate, negatively electrically charging electrodes disposed at an evaporation source in the evaporation chamber, and forming an electric field.

S403: introducing argon gas into the evaporation chamber, forming electrons in the evaporation chamber after the argon gas is ionized under the action of the electric field, placing an evaporation material corresponding to the red OLED material required to be deposited into the evaporation source, evaporating the evaporation material, allowing the evaporation material to adsorb electrons to form negatively charged particles, depositing the ionized evaporation material on the base substrate under the action of the electric field, and removing the base substrate.

S404: etching the base substrate provided with the ionized evaporation material by an etching process, and retaining the red OLED material only on the previously charged pixel electrodes on the base substrate.

S405: placing the base substrate into the evaporation chamber, positively electrically charging pixel electrodes of pixel units, required to be deposited with a green OLED material, on the base substrate, negatively electrically charging the electrodes disposed at the evaporation source in the evaporation chamber, and forming an electric field.

S406: introducing argon gas into the evaporation chamber, forming electrons in the evaporation chamber after the argon gas is ionized under the action of the electric field, placing an evaporation material corresponding to the green OLED material required to be deposited into the evaporation source, evaporating the evaporation material, allowing the evaporation material to adsorb the electrons to form negatively charged particles, depositing the ionized evaporation material on the base substrate under the action of the electric field, and removing the base substrate.

S407: etching the base substrate provided with the ionized evaporation material by an etching process, and only retaining the green OLED material on the previously charged pixel electrodes on the base substrate.

S408: placing the base substrate into the evaporation chamber, positively electrically charging pixel electrodes of pixel units, required to be deposited with a blue OLED material, on the base substrate, negatively electrically charging the electrodes disposed at the evaporation source in the evaporation chamber, and forming an electric field.

S409: introducing argon gas into the evaporation chamber, forming electrons in the evaporation chamber after the argon gas is ionized under the action of the electric field, placing an evaporation material corresponding to the blue OLED material required to be deposited into the evaporation source, evaporating the evaporation material, allowing the evaporation material to adsorb the electrons to form negatively charged particles, depositing the ionized evaporation material on the base substrate under the action of the electric field, and removing the base substrate.

S410: etching the base substrate provided with the ionized evaporation material by an etching process, and only retaining the blue OLED material on the previously charged pixel electrodes on the base substrate.

After the steps S401 to S410 provided by the embodiment 3, the pixel electrodes of the pixel units deposited with the red OLED material, the green OLED material and the blue OLED material are formed, and hence the OLED display panel provided by at least one embodiment of the present disclosure is manufactured.

At least one embodiment of the present disclosure provides an OLED display panel, which is manufactured by the method for manufacturing the OLED display panel, provided by the above embodiment. By adoption of the above method to manufacture the OLED display panel, the alignment error in the process of forming patterns of material with a mask can be avoided, and hence the resolution of finished products is higher. Therefore, the resolution of the OLED can be improved. The description of the embodiments of the OLED display panel can be referred to the embodiments of the method for manufacturing the OLED display panel. No further description will be given here.

At least one embodiment of the present disclosure further provides a display device, which comprises the OLED display panel provided by at least one embodiment of the present disclosure. The display panel may be any product or component with display function, e.g., a mobile phone, a tablet computer, a television, a display, a notebook computer, a digital picture frame, a navigator and a watch. The description of the embodiments of the display device may refer to the embodiments of the OLED display panel. No further description will be given here.

In the OLED display panel, the manufacturing method thereof and the display device, provided by at least one embodiment of the present disclosure, a base substrate provided with pixel electrodes of pixel units is placed into an evaporation chamber; pixel electrodes of pixel units, required to be deposited with the same material, on the base substrate are electrically charged, and electrodes disposed at an evaporation source in the evaporation chamber are electrically charged to form an electric field; and evaporation material corresponding to the material required to be deposited is placed into the evaporation source and ionized, and the ionized evaporation material is deposited on the base substrate under the action of the electric field. As only the pixel electrodes required to be deposited with the material are charged, the thickness of the deposited material of the pixel units required to be deposited with the material is larger than that of other pixel units. The base substrate provided with the ionized evaporation material is etched by an etching process; the material deposited in other pixel units may be etched off and removed; and the evaporation material only on the previously charged pixel electrodes on the base substrate is retained. In this way, patterns of the required material are formed in the processes of deposition and etching in turn, and hence the alignment error in the process of forming the patterns of the material with a mask is avoided, and consequently the resolution of finished products is limited. Therefore, the resolution of the OLED can be improved.

The foregoing is only the preferred embodiments of the present disclosure and not intended to limit the scope of protection of the present disclosure. The scope of protection of the present disclosure should be defined by the appended claims.

The application claims priority to the Chinese patent application No. 201410419804.5 submitted on Aug. 22, 2014. The disclosure of the Chinese patent application is entirely incorporated herein by reference as part of the application.

What is claimed is:

1. A method for manufacturing an organic light-emitting diode (OLED) display panel, comprising:
   placing a base substrate provided with pixel electrodes of pixel units into an evaporation chamber;
   electrically charging pixel electrodes of pixel units, required to be deposited with a material, on the base substrate, electrically charging electrodes disposed at an evaporation source in the evaporation chamber, and forming an electric field;
   placing an evaporation material corresponding to the material required to be deposited into the evaporation source, ionizing the evaporation material, and depositing the ionized evaporation material on the base substrate under the action of the electric field; and
   etching the base substrate provided with the ionized evaporation material by an etching process, and retaining the evaporation material only on the previously charged pixel electrodes on the base substrate.

2. The method according to claim 1, wherein the process of ionizing the evaporation material comprises:
   evaporating the evaporation material after the evaporation material corresponding to the material required to be deposited is placed into the evaporation source, allowing free electrons in the electric field to collide with the evaporated evaporation material, and ionizing the evaporation material into positively charged particles.

3. The method according to claim 1, wherein the process of ionizing the evaporation material comprises:
   polarizing the evaporation material under the action of an external electric field before the evaporation material corresponding to the material required to be deposited is placed into the evaporation source, namely polarizing the evaporation material into positively charged particles.

4. The method according to claim 2, wherein the pixel electrodes of the pixel units, required to be deposited with the material, on the base substrate are negatively electrically charged, and the electrodes disposed at the evaporation source in the evaporation chamber are positively electrically charged.

5. The method according to claim 3, wherein the pixel electrodes of the pixel units, required to be deposited with the material, on the base substrate are negatively electrically charged, and the electrodes disposed at the evaporation source in the evaporation chamber are positively electrically charged.

6. The method according to claim 1, wherein the process of ionizing the evaporation material comprises:

introducing argon gas into the evaporation chamber before the evaporation material corresponding to the material required to be deposited is placed into the evaporation source, and forming electrons in the evaporation chamber after the argon gas is ionized under the action of the electric field; and evaporating the evaporation material after the evaporation material corresponding to the material required to be deposited is placed into the evaporation source, and allowing the evaporation material to adsorb the electrons to form negatively charged particles.

7. The method according to claim 6, wherein the pixel electrodes of the pixel units, required to be deposited with the same material, on the base substrate are positively charged, and the electrodes disposed at the evaporation source in the evaporation chamber are negatively charged.

8. The method according to claim 1, wherein the evaporation material comprises a red OLED material, a green OLED material or a blue OLED material.

* * * * *